United States Patent
Kim

[19]

[11] Patent Number: 5,982,214
[45] Date of Patent: Nov. 9, 1999

[54] VARIABLE DELAY CIRCUIT

[75] Inventor: Chang-Sun Kim, Seoul, Rep. of Korea

[73] Assignee: LG Semicon Co., Ltd., Cheongju, Rep. of Korea

[21] Appl. No.: 08/905,774

[22] Filed: Aug. 4, 1997

[30] Foreign Application Priority Data

Aug. 6, 1996 [KR] Rep. of Korea ................. 96/32703

[51] Int. Cl.⁶ .................................................. H03K 5/13
[52] U.S. Cl. ........................ 327/280; 327/287; 327/277
[58] Field of Search .................................. 327/261, 263,
327/266, 268, 271, 274, 277, 280, 283,
284, 287, 290

[56] References Cited

U.S. PATENT DOCUMENTS

| | | | |
|---|---|---|---|
| 4,771,196 | 9/1988 | Mead et al. | 327/277 |
| 4,801,827 | 1/1989 | Metz | 327/280 |
| 4,820,943 | 4/1989 | Makino et al. | |
| 4,821,003 | 4/1989 | Kameya | 327/277 |
| 4,890,022 | 12/1989 | Endo | 327/261 |
| 5,461,335 | 10/1995 | Tsuchiya | 327/280 |
| 5,467,041 | 11/1995 | Baba et al. | |
| 5,495,197 | 2/1996 | Hayashi et al. | |

*Primary Examiner*—Timothy P. Callahan
*Assistant Examiner*—Eunja Shin
*Attorney, Agent, or Firm*—Fleshner & Kim

[57] ABSTRACT

A variable delay circuit for a semiconductor memory device includes an input buffer for converting a digital input signal to an analog signal and buffering the resultant analog signal, an analog delay unit for delaying the analog signal outputted from the input buffer unit for a certain time, and an output buffer unit for converting the delayed analog signal to a digital signal and buffering the resultant digital signal. The analog delay unit is composed of a CMOS inverter, a plurality of operational transconductance amplifier-capacitor delay elements, and an output inverter, to form a second-order Bessel filter. An O.T.A and an inverter may be additionally provided between the plurality of O.T.A.'s for thereby decreasing a parasitic effect of the capacitors connected to the outputs of each of the plurality of O.T.A.'s in the analog delay unit. The delay circuit serves to obtain a desired delay time by varying a control voltage irrespective of unstable time delay values of components caused by the fabrication process.

17 Claims, 3 Drawing Sheets

FIG. 1
CONVENTIONAL ART
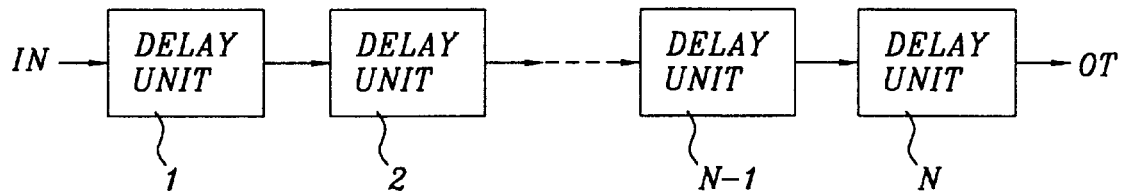
FIG. 2
CONVENTIONAL ART
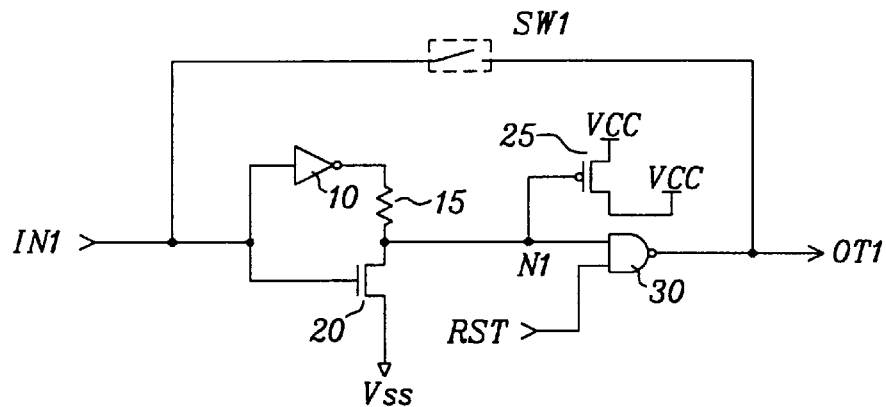
FIG. 3A
CONVENTIONAL ART
FIG. 3B
CONVENTIONAL ART
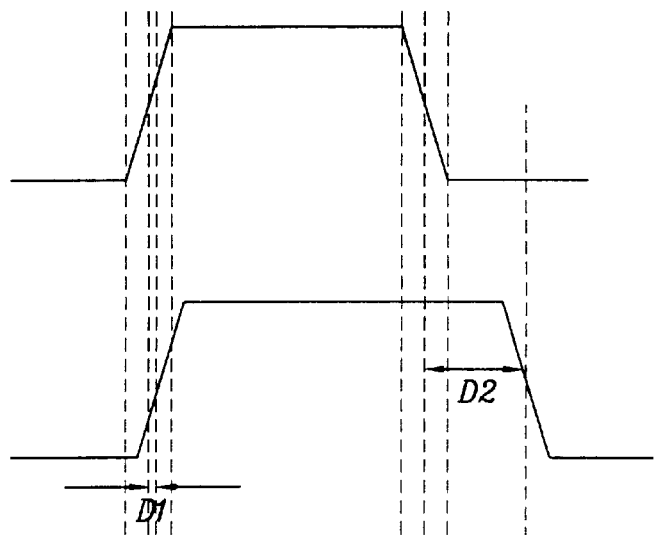

VARIABLE DELAY CIRCUIT

BACKGROUND OF THE INVENTION

1. Field of the Invention

The present invention relates to a variable delay circuit, and more particularly to a variable delay circuit suitable for integration into a semiconductor memory device and capable of variably delaying an input signal by means of an OTA-C (operational transconductance amplifier-capacitor filter), when there occurs a change in a fabrication process or an input voltage.

2. Description of the Prior Art

Typically, as shown in FIG. 1, a conventional delay circuit in a conventional semiconductor memory device is composed of a plurality N of delay units (1–N) in series.

As shown in FIG. 2, each of the delay units includes: an inverter 10 for inverting an input signal IN1; an NMOS transistor 20 to the drain of which the output from the inverter 10 is applied through a resistance 15, to the gate of which the input signal IN1 is applied, and the source of which is connected to a ground voltage Vss potential; a PMOS transistor 25 configured as a capacitor and to the gate of which the drain of the NMOS transistor 20 is connected, and to the drain and source of which a supply voltage Vcc is applied; a NAND gate 30 for NANDing the output from the drain of the NMOS transistor 20 and a reset signal RST for thereby generating an output signal OT1; and a switch SW1 for switching a parallel shunt connection line also carrying the input signal IN1 and generating the output signal OT1.

With reference to FIGS. 3A and 3B, the operation of the thusly composed conventional delay circuit will now be described.

First, as shown in FIG. 3A, with switch SW1 opened (turned off) when the input signal IN1 transits from low to high, the inverter 10 inverts the transited high level signal to a low level. At the same time, the NMOS transistor 20, to the gate of which the input signal IN1 is applied, is turned on by the transited high signal IN1 and also discharges through the NMOS transistor 20 the supply voltage Vcc charged on the PMOS transistor capacitor 25 from the node N1, to ground Vss. As a result, the NAND gate 30 outputs a high level signal in accordance with the level at node N1 and the signal from the reset terminal RST.

Therefore, as shown in FIG. 3B, during the rising edge of the input signal IN1, the discharging of the PMOS transistor capacitor 25 is hurried through the NMOS transistor 20, thereby causing a certain time delay D1 with respect to the rising of output signal OT1. Conversely, during a falling edge of the input signal IN1, the NMOS transistor 20 is turned off according to the transited signal, and the inverter 10 inverts the low level input signal IN1 to a high level signal.

During the transition of the input signal IN1, the PMOS transistor 25 capacitor is discharged until the voltage at the node N1 reaches a high level, and the NAND gate 30 NANDs the high level signal at the node N1 and a high signal from the reset terminal RST, thereby outputting a low level output signal OT1.

So, during a rising edge of the input signal IN1, because the output signal OT1 depends on the RC time constant of the resistance 15 and the PMOS transistor capacitor 25 and thus requires a longer time to rise, the time delay D2 during a falling edge of the input signal IN1 remains longer than the time delay D1 during a rising edge of the input signal N1.

When a time delay is not required, the switch SW1 connected to the output of the NAND gate 30 is respectively closed (turned on), whereby the input signal is directly outputted without passing through the delay circuit.

However, the conventional delay circuit of the semiconductor memory device delays the input signal by using the resistance 15 and the PMOS transistor capacitor 25 which are respectively sensitive to the fabrication process and the supply voltage Vcc, thereby causing an instability in the delay time.

Particularly, for obtaining a longer delay time than 5 ns, more delay circuits had to be serially connected to each other, thereby causing difficulties in application to a highly integrated circuit.

SUMMARY OF THE INVENTION

Accordingly, it is an object of the present invention to provide a variable delay circuit for a semiconductor memory device capable of controlling a time delay occurring therein, of solving the conventional instability problem subject to the fabrication process and the supply voltage, and also of reducing the area required therefor.

To achieve the above-described object, there is provided a variable delay circuit according to the present invention includes an input buffer for converting a digital input signal to an analog signal and buffering the resultant signal, an analog delay unit for delaying the analog signal outputted from the input buffer unit for a certain time, and an output buffer unit for converting the delayed analog signal to a digital signal and buffering the resultant signal.

Further, the analog delay unit includes a CMOS inverter for inverting the analog signal applied thereto from the input buffer, a plurality of OTAs (operational transconductance amplifiers) connected in series for each varying an output current by delaying the output signal of the CMOS inverter in accordance with a control signal, a capacitor connected in parallel with an output of each of the OTAs, and an inverter for inverting the delayed signal outputted through the OTAs.

BRIEF DESCRIPTION OF THE DRAWINGS

FIG. 1 is a block diagram of a conventional delay circuit;

FIG. 2 is a circuit diagram showing details of a delay unit in the circuit of FIG. 1;

FIG. 3A shows an input wave form timing in the circuit of FIG. 2;

FIG. 3B shows an output wave form timing in the circuit of FIG. 2;

DETAILED DESCRIPTION OF THE PRESENT INVENTION

Figure 4:
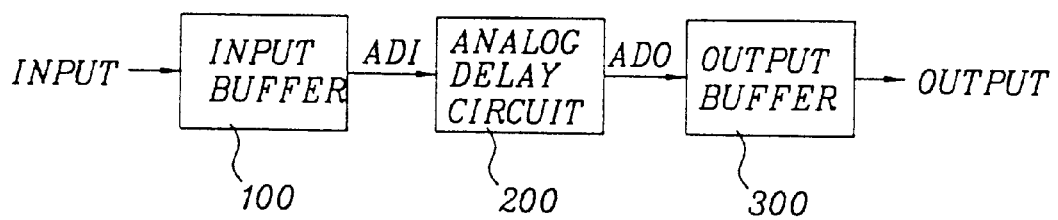
FIG. 4 is a block diagram of a variable delay circuit according to the present invention.

As shown in FIG. 4, a variable delay circuit according to the present invention for integration into a semiconductor memory device includes: an input buffer 100 for converting a digital input signal INPUT to an analog signal and buffering the resultant analog signal; an analog delay circuit 200 for delaying the analog signal AD1 outputted from the input buffer unit 100 for a certain time; an output buffer unit 300 for converting the delayed analog signal AD0 outputted from the analog delay circuit 200 to a digital signal and buffering outputting the resultant digital signal output.

Figure 5:
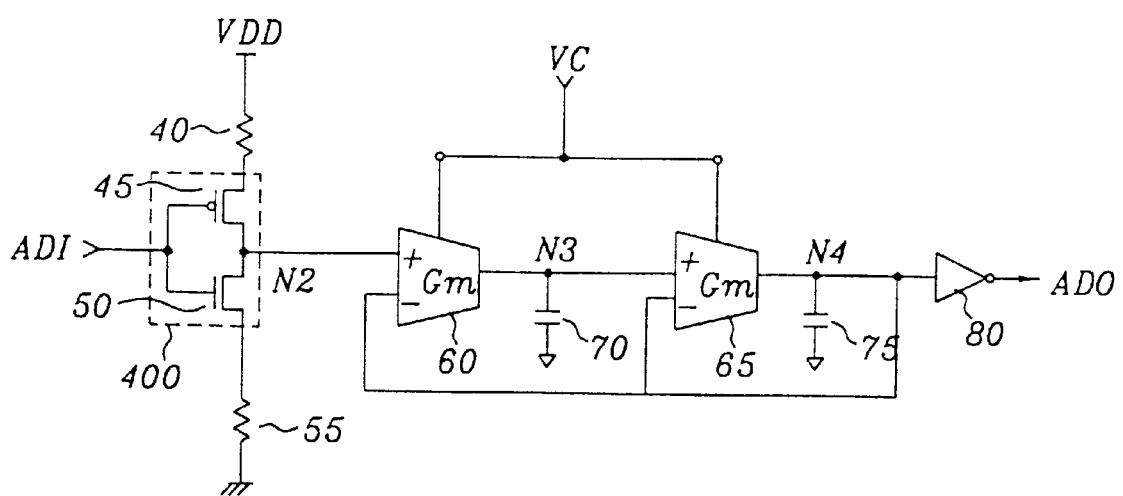
FIG. 5 is a circuit diagram showing details of an analog delay circuit in the circuit of FIG. 4 according to a first embodiment of the present invention.

Referring to FIG. 5, the analog delay circuit 200 in accordance with a first embodiment of the present invention includes: a CMOS inverter 400 composed of a PMOS transistor 45 to the source of which a supply voltage Vdd is applied via a resistance 40, to the gate of which the analog signal AD1 outputted from the input buffer 100 is applied, and the drain of which is connected with the drain of an NMOS transistor 50 at a node N2; NMOS transistor 50 to the gate of which the analog signal AD1 is also applied, and the source of which is connected via a resistance 55 to a ground voltage Vss; a first OTA (operational transconductance amplifier) 60 for receiving via the node N2 the output from the CMOS inverter 400 at a non-inverting input terminal thereof; a second OTA 65 for receiving via a node N3 at its non-inverting input the output from the first OTA 60; a first capacitor 70 connected in parallel with the node N3 between the first and second OTAs 60, 65; an inverter 80 receiving via a node N4 the output from the second OTA 65 and outputting the delayed signal AD0; and a second capacitor 75 connected in parallel with the node N4 between the second OTA 65 and the inverter 80.

The output from the second OTA 65 via the node N4 is fed back to the inverting input terminals of each of the first and second OTAs 60, 65, and a control voltage VC is applied to the control terminal each of the OTAs 60, 65.

Figure 6:
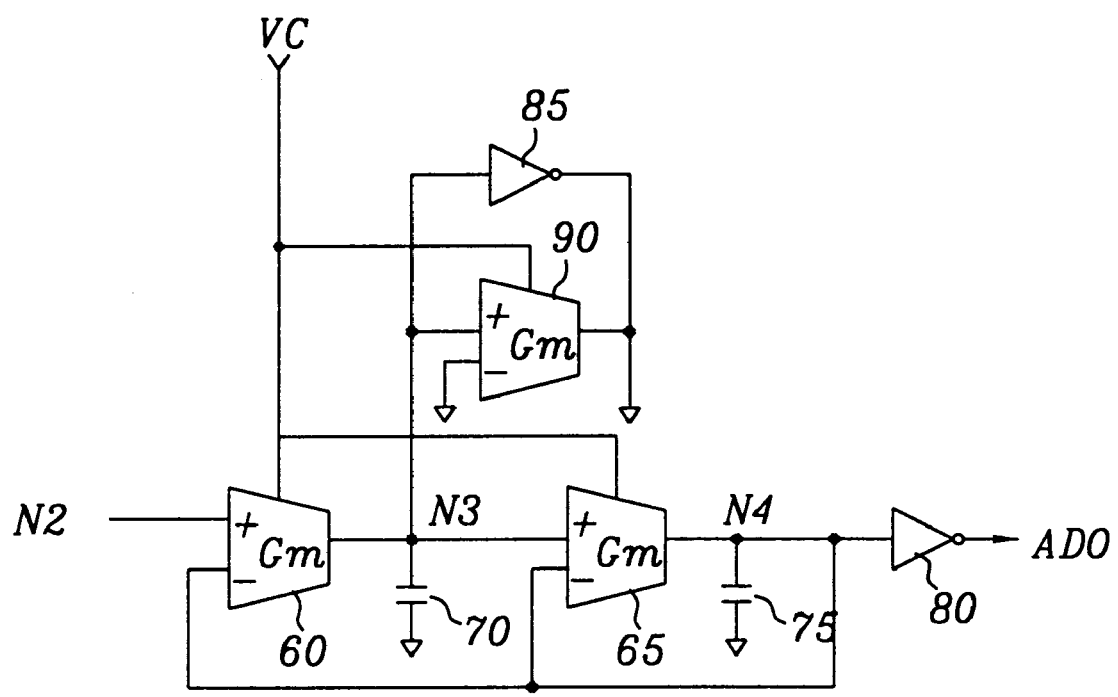
FIG. 6 is a circuit diagram showing details of an analog delay circuit in the circuit of FIG. 4 according to a second embodiment of the present invention.

With reference to FIG. 6, a variable delay circuit in accordance with a second embodiment of the present invention modifies the circuit of FIG. 5 for exhibiting a decreased parasitic effect of the thusly composed analog delay circuit 200 by supplementing the circuit as shown in FIG. 5 to further include: a third OTA 90 the non-inverting input terminal of which is connected to the first capacitor 70 and the node N3, the inverting input terminal of which is connected to ground, to the control terminal of which the control voltage VC is applied, and the output terminal of which is connected to ground; and a second inverter 85 for receiving an input via the node N3 and having its output connected to ground.

With reference to FIGS. 4 through 6, the operation of the thusly constructed variable delay circuit for a semiconductor memory device will now be explained.

First, as shown in FIG. 4, when an inputted digital signal INPUT is applied to the input buffer 100, the digital signal INPUT is converted to an analog signal by the input buffer 100, buffered and sent to the analog delay unit 200 as analog signal AD1. In the input buffer unit 100, each step of converting the digital signal to an analog signal and buffering the resultant analog signal is based on the fact that the range of the digital signal swinging varies from zero to a level reaching up to the supply voltage Vcc prior to buffering the resultant analog signal.

In the delay unit 200, the analog signal AD1 which was converted and buffered sequentially via the input buffer 100 is delayed for a certain time according to the level of the externally applied control voltage VC, and then the delayed signal AD0 is applied to the output buffer 300.

Also, in the output buffer 300, the signal AD0 delayed in the analog delay unit 200 is converted to a digital signal and buffered accordingly for thereby outputting the resultant delayed digital signal OUTPUT therefrom.

As shown in FIG. 5, the analog delay circuit 200 is composed of an OTA-C filter which is realized to have a characteristic of a second order Bessel maximally flat delay low pass filter.

The second order Bessel maximally flat delay low pass filter will now be described with regard to the following transfer function equations (1) through (3).

Equation (1) denotes a typical n-dimensional Bessel transfer function.

$$H(s) = \frac{b_0}{S^n + b_{n-1}S^{n-1} + b_1 S + b_0} \quad (1)$$

Here, since the variable delay circuit of the present invention is realized as a second order Bessel low pass filter, the second transfer function of the OTA-C filter is defined by equation (2). The Bessel low pass filter is characteristic in having a certain delay time irrespective of its frequency, thereby obtaining a fixed time delay.

$$H(s) = \frac{W_0^2}{S^2 + \frac{W_0}{Q_0}S + W_0^2} \quad (2)$$

Here, $b_0$ is equal to $W_0$, and $b_1 = W_0/Q_0$. When the resonant frequency:

$$W_0 = Gm / \sqrt{C_1 C_2}$$

and quality factor:

$$Q_0 = C_2/C_1$$

are substituted into the equation, the resulting equation is as follows.

$$H(s) = \frac{Gm^2 / C_1 C_2}{S^2 + Gm / SC_2 + Gm^2 / C_1 C_2} \quad (3)$$

As shown in equation 3, the transfer function of the delay circuit of the present invention is directly related to the transconductance. The transconductance which is reciprocal to resistance, as shown in equation 4, is proportional to the difference between a voltage Vgs, which occurs between a gate and ground, and a threshold voltage Vt. The voltage Vgs serving as the control voltage VC in the present invention, as shown in FIG. 5, is proportional to the first and second transconductance control voltages VC.

$$Gm = \beta(Vgs - Vt) \quad (4)$$

As shown in equation 5, because in the OTA-C circuit the output current charged in the transconductance capacitor is defined by the value of the transconductance, the output signal delay time is ultimately determined by the control voltage. That is, the higher the control voltage applied thereto, the larger becomes the value of Gm. Accordingly, the output current is largely charged by the OTA, whereby the output signal is less delayed.

$$I_0 = Gm(Vin^+ - Vin^-) \quad (5)$$

Here, Gm denotes the transconductance of a MOS transistor, and, represents the gain factor of the MOS transistor. $Vin^+$ is the input voltage at the non-inverting input terminal. $Vin^-$ is the input voltage at the inverting input terminal. When the difference between $Vin^+$ and $Vin^-$ is greater than zero, the current moves in a forward direction and when the difference is less than zero, the current moves in a reverse direction.

However, although the delay time is controlled in its own circuit, the delay property can become imprecise due to a parasitic effect occurring between the first and second OTAs 60, 65.

To overcome such problems, extra circuitry must be added to the above-described delay circuit.

As shown in FIG. 6, the second inverter 85 and the third OTA 90 are extended from the node N3, so that the capacitances of the first and second capacitors 70, 75 are made identical to each other.

That is, the node N3 in FIG. 5 is connected to the output from the first OTA 60, and to the non-inverting input of the second OTA 65, so that there may occur a capacitance imbalance between the first capacitor 70 connected to the node N3 and the second capacitor 75 connected to the node N4, thereby generating a parasitic effect.

The parasitic effect in the delay circuit of FIG. 5 will be explained by the equations as follows, wherein the capacitance $C_3$ at node N3 is incorporated in equation 6, and the capacitance $C_4$ at node N4 in equation 7. $C_1$ is the capacitance of the first capacitor 70. $C_2$ is the capacitance of the second capacitor 75. $Cvin^+$ is the capacitance at the non-inverting input of OTA 65. $Cinv^-$ is the capacitance at the inverting input of OTA 65. Cout is the capacitance at the output AD0.

$$C_3 = C_1 + 1*Cvin_+ + 1*Cout \quad (6)$$

$$C_4 = C_2 + 2*Cvin_- + 1*Cout + Cinv \quad (7)$$

Here, $Cvin^+$ and $Cvin^-$ having the same value, can be incorporated into Cvin as in equations 8 and 9, whereby a capacitance difference between the nodes N3 and N4 remains unbalanced with regard to its value.

$$C_3 = C_1 + 1*Cin + 1*Cout \quad (8)$$

$$C_4 = C_2 + 2*Cin + 1*Cout + Cinv \quad (9)$$

To overcome the above-described parasitic effect, the second inverter 85 and the third OTA 90 are additionally connected to the node N3 between the first and second OTAs 60, 65 for thereby balancing the pair of capacitors 70, 75. As a result, the capacitance at node N3 remains the same as that at node N4.

As described above, the variable delay circuit according to the present invention is designed so as to obtain a desired time delay by varying the control voltage VC irrespective of unstable time delay components (R, C) caused by the fabrication process.

Further, a wider range of delay values can be obtained in a relatively small region, so that the present invention is appropriate to highly integrated semiconductor circuits.

Still further, parasitic effects which can occur in a variable delay circuit can be avoided to realize a much more appropriate delay circuit, thereby accurately securing a desired delay value.

What is claimed is:

1. A variable delay circuit, comprising:
   an input buffer that buffers an input signal to output a first signal;
   a delay circuit that delays the first signal provided from the input buffer for a prescribed time, wherein the delay circuit comprises,
   a plurality of operational transconductance amplifiers (OTAs) coupled in series to delay the first signal in accordance with an applied control signal,
   a plurality of capacitors, wherein each of the capacitors is coupled to an output terminal of a corresponding one of the OTAs,
   at least one compensating unit, wherein each of the compensating units is coupled to the output terminal of a corresponding one of the plurality of OTAs to reduce a parasitic effect in the first signal delayed for the prescribed time; and
   an output buffer that buffers the first signal delayed for the prescribed time.

2. The variable delay circuit of claim 1, wherein the first signal is an analog signal, and wherein the output buffer outputs a second signal.

3. The variable delay circuit of claim 1, wherein each of the at least one compensating unit comprises:
   a compensating operational transconductance amplifier (OTA); and
   a logic-gate, which is coupled in parallel to the compensating OTA between the output terminal of a corresponding OTA in the plurality of OTAs and a reference terminal.

4. The variable delay circuit of claim 3, wherein the reference terminal is a ground terminal, and the logic-gate is an inverter.

5. The variable delay circuit of claim 3, wherein the at least one compensating unit reduces a parasitic effects caused by the plurality of capacitors.

6. The variable delay circuit of claim 1, wherein the at least one compensating unit is a plurality of compensating units that reduce a parasitic effect in the first signal delayed for the prescribed time.

7. The variable delay circuit of claim 1, further comprising:
   a first inverter that inverts the first signal from the input buffer; and
   a second inverter that inverts the first signal delayed for the prescribed time, wherein the first inverter is a CMOS inverter.

8. The variable delay circuit of claim 1, wherein the applied control signal is a variable control voltage, and wherein each of the plurality of OTAs receives the control signal at a control terminal.

9. The variable delay circuit of claim 1, wherein the output buffer receives the first signal delayed for the prescribed time and outputs a delayed buffered output signal.

10. The variable delay circuit of claim 1, wherein the input signal is a digital signal, and the input buffer comprises an D/A converter that converts the digital input signal, and wherein the output buffer comprises a A/D converter that converts the first signal delayed for the prescribed time to a delayed digital signal, which is buffered by the output buffer.

11. The variable delay circuit of claim 1, wherein a pair of series coupled OTAs is coupled to the plurality of OTAs to increase a period of the prescribed time and further delay the first signal.

12. A delay circuit, comprising:
   a plurality of operational transconductance amplifiers (OTAs) having first and second input terminals and an output terminal, wherein the plurality of OTAs are coupled in series to delay an input signal for a prescribed time in accordance with an applied control signal, wherein the second input terminal of each of the OTAs receives an output signal of a corresponding OTA of the plurality of OTAs, and wherein the first input terminal of the first OTA of the plurality of OTAs receives the input signal, and wherein the first input terminal of the remaining OTAs of the plurality of OTAs are coupled to the output terminal of the preceding OTA;

a plurality of capacitors, wherein each of the capacitors is coupled to the output terminal of a corresponding one of the OTAs; and a plurality of compensating units, wherein each of the compensating units is coupled to the output terminal of a corresponding one of the plurality of OTAs to reduce a parasitic effect in the delayed input signal.

13. The delay circuit of claim 12, wherein each of the plurality of compensating units comprises a compensating operational transconductance amplifier (COTA) having a first input terminal coupled to the output terminal of corresponding OTA in the plurality of OTAs, wherein a second input terminal and an output terminal of the COTA are coupled to a reference terminal.

14. The delay circuit of claim 13, wherein each of the plurality of compensating units further comprises a logic-gate coupled in parallel to the compensating OTA between the output terminal of the corresponding OTA and the reference terminal, wherein the plurality of compensating units reduce parasitic effects caused by the plurality of capacitors.

15. The delay circuit of claim 14, wherein the reference terminal is a ground terminal, the logic-gate is an inverter and a control terminal of each of the compensating COTAs receives the control signal.

16. The delay circuit of claim 12, wherein the input signal is an analog signal.

17. An analog delay circuit, comprising:

a plurality of operational transconductance amplifiers (OTAs) coupled in series to delay an analog signal for a prescribed time in accordance with a control signal applied to a control terminal of each of the plurality of OTAs;

a plurality of capacitors, wherein each of the capacitors is coupled to an output terminal of a corresponding one of the OTAs; and at least one compensating units, wherein each of the at least one compensating units, comprises, a compensating operational transconductance amplifier (OTA) coupled between the output terminal of the corresponding OTA in the plurality of OTAs and a reference terminal, wherein the control signal is applied to a control terminal of the compensating OTA, and a logic circuit coupled in parallel to the compensating OTA between the output terminal of the corresponding OTA and the reference terminal, wherein the at least one compensating units reduce parasitic effects caused by the plurality of capacitors.

* * * * *